United States Patent [19]

Brown et al.

[11] 4,216,051

[45] Aug. 5, 1980

[54] APPARATUS FOR MAKING BONDABLE FINGER CONTACTS

[75] Inventors: Vernon L. Brown, Boulder; Wade H. Greenwood, Northglenn; Gary L. Griffith, Arvada, all of Colo.

[73] Assignee: Bell Telephone Laboratories, Incorporated, Murray Hill, N.J.

[21] Appl. No.: 56,534

[22] Filed: Jul. 11, 1979

Related U.S. Application Data

[62] Division of Ser. No. 891,038, Mar. 28, 1978, Pat. No. 4,179,322.

[51] Int. Cl.² ............... B32B 31/00; B31F 5/00; B65C 11/04
[52] U.S. Cl. ............... 156/499; 156/510; 156/554; 156/555; 156/578
[58] Field of Search ............... 156/390, 510, 554, 555, 156/578, 499

[56] References Cited

U.S. PATENT DOCUMENTS

| | | | |
|---|---|---|---|
| 2,422,676 | 6/1947 | Hamen | 156/554 |
| 2,468,239 | 4/1949 | Saulino | 18/59 |
| 2,559,649 | 7/1951 | Little | 156/231 |
| 3,132,581 | 5/1964 | Isbey | 156/555 |
| 3,223,574 | 12/1965 | Childs | 156/555 |
| 3,396,461 | 8/1968 | Spooner | 29/630 |
| 3,703,603 | 11/1972 | Levesque | 174/68.5 |
| 3,704,515 | 12/1972 | Nelson | 29/626 |
| 3,756,896 | 9/1973 | Kono | 156/554 |
| 3,938,246 | 2/1976 | Over | 29/628 |
| 4,044,201 | 8/1977 | Wallick | 174/52 |
| 4,044,460 | 8/1977 | Schachter | 29/628 |
| 4,044,888 | 8/1977 | Schachter | 206/330 |
| 4,050,976 | 9/1977 | Reiters | 156/233 |

*Primary Examiner*—Douglas J. Drummond
*Attorney, Agent, or Firm*—John W. Fisher

[57] ABSTRACT

Apparatus is disclosed for making bondable finger contacts (101) for application to printed circuit boards. The finger contacts are formed from a thin strip (102) of electrically conductive material. Following the application of a thin layer of contact metal (201) to the contact area, a strip of adhesive tape (109) is applied to the plated side of the contacts to protect the contacts, to interconnect and support them during subsequent handling, and to provide a compliant surface which aids in the application of the contacts to a circuit board. On an opposite side of the contacts there is applied a thermally curable adhesive (301) which, when brought into pressure contact with the circuit board and a moderate amount of heat is applied, will fasten the contacts to the board.

8 Claims, 7 Drawing Figures

APPARATUS FOR MAKING BONDABLE FINGER CONTACTS

CROSS-REFERENCE TO RELATED APPLICATION

This application is a division of application Ser. No. 891,038, filed Mar. 28, 1978, now U.S. Pat. No. 4,179,322.

This application is related to the copending application of L. Carrillo and T. C. Madden entitled "Apparatus and Method for Affixing Bondable Finger Contacts to a Printed Circuit Board" filed Mar. 28, 1978 having Ser. No. 891,039 and assigned to the same assignee as this application.

BACKGROUND OF THE INVENTION

1. Technical Field of the Invention

This application relates to electrical contacts and, more particularly, to apparatus and a method for making electrical contacts which are bondable to printed circuit boards.

2. Description of the Prior Art

A conventional method for electrically connecting plug-in printed circuit boards to mating backplane connectors utilizes patterned and plated fingers at the board edge. These fingers are usually an extension of the circuit pattern. They are plated with a sequence of metallization layers to provide low contact resistance between the mating parts of the connector over the circuit life.

Another method for providing finger contacts on printed circuit boards is disclosed in H. E. Spooner et al U.S. Pat. No. 3,396,461, issued Aug. 13, 1968. In Spooner et al the contact elements are carried on a common support strip. This strip is positioned over the conductor patterns on the circuit board thereby bringing the contact elements into alignment with the conductor patterns. The contact elements are then bonded to the conductor patterns by welding or soldering after which the common support strip is removed.

Still another method for terminating printed circuit boards utilizes a double-sided piece of adhesive tape to fasten a connector along an edge of the board. This approach to board termination is disclosed in R. D. Nelson, U.S. Pat. No. 3,704,515, issued Dec. 5, 1972. In Nelson the connector contacts are bent at right angles to facilitate engagement with apertures in the printed circuit board. Once the contacts are inserted into the apertures, they are held securely in place by solder.

A somewhat related method for terminating circuit modules is disclosed in C. W. Wallach U.S. Pat. No. 4,044,201, issued Aug. 23, 1977. In Wallach a lead frame assembly includes a pair of spaced-apart, parallel carrier strips with a plurality of collapsible rungs extending between the strips at regular intervals along its length. The rungs are collapsed inwardly to seat against the sides of the circuit module which is positioned between the ends of the leads. After seating, the lead ends are soldered to metallized surfaces on the module. Following bending of the leads, the carrier strips and rungs are cut away.

Apparatus for attaching multiconductor flat cable to an electrical connector is disclosed in W. R. Over et al, U.S. Pat. No. 3,938,246, issued Feb. 17, 1976. The apparatus employs a movable ram which moves through multiple strokes to perform all of the necessary steps. A movable connector holder is utilized so that cables may be attached to opposite faces of the connector by using a single, movable ram. The contacts used in effecting this type of termination are manufactured by punching a thin strip of metal to form individual contacts. Plastic carrier strips are applied to opposite edges of the contacts to provide support after the contacts are severed from their metallic support strip.

None of the aforementioned references addresses the problem of providing protection, support and compliance to the finger contacts during the attachment process and during subsequent handling operations. Moreover, these references do not address the problem of effecting repairs to an individual contact which might be damaged during subsequent usage of the board.

Our invention overcomes these problems because the finger contacts are manufactured separately from the printed circuit board itself. Moreover, our finger contacts can be advantageously mass terminated to a printed circuit board. In addition, the plated contact areas are protected during installation and subsequent handling. By virtue of this approach to solving the aforementioned problems individual finger contacts which may become damaged during subsequent handling or use can be advantageously repaired.

A further aspect of our invention is that finger contacts may be advantageously applied to a printed circuit board at any stage of its manufacture both before and after the components are attached. Further aspects of our invention are that the finger contact strip configuration allows at least two different circuit attachment methods to be employed. In particular, both wave soldering and reflow soldering attachment techniques can be advantageously employed. For wave soldering attachment, the finger contacts are electrically connected to the circuit board during the normal wave soldering operation employed to electrically attach the circuit elements. In addition, the wave soldering option facilitates electrical attachment of finger contacts on both sides of the circuit board even though the printed circuit may appear on only one side of the board. As a result the manufacturing cost of printed circuit boards is significantly reduced.

Another aspect of our invention is that the finger contacts can be advantageously affixed to other areas of a printed circuit board other than along an edge region thereof.

SUMMARY OF THE INVENTION

The foregoing aspects of the invention are realized in an illustrative embodiment of a method for making bondable finger contacts for application to a printed circuit board. In accordance with the method, a strip of virtually continuous, flat, electrically conductive material is formed to produce a plurality of spaced-apart finger contacts integral with and interconnected by at least one support carrier. Each of the finger contacts has a contact region thereon. A tape, having an adhesive on one side, is applied to one side of the contact region to protect, interconnect and support the contacts. A coat of thermally curable adhesive is applied to an opposite side of the contact region to facilitate bonding of the contacts to the printed circuit board.

Accordingly, it is an advantage of one embodiment of the present invention that the finger contacts are manufactured separately from the printed circuit board itself.

Another advantage of one embodiment is that a coating of contact metal is selectively applied to only the contact region of the finger contacts. In addition, a relatively thin coating of gold is applied selectively to the tails of the finger contacts to protect their solderability and to virtually eliminate the need for a soldered strip when used in a wave soldering application.

A further advantage of one embodiment of the present invention is that the finger contacts are adhesively bonded to the printed circuit board.

Still another advantage of one embodiment is that the finger contacts are designed so that they can be advantageously electrically connected to a printed circuit board by wave soldering, reflow soldering, or with a soldering iron.

Yet a further advantage of one embodiment of the present invention is that the finger contacts are made semirigid so that the adhesive takes up surface irregularities in the printed circuit board material while the contact surface remains flat. In addition, the semirigidness of the finger contacts allows the tails to be inserted through apertures in printed circuit boards.

Still another advantage of one embodiment of the present invention is that a protective tape is used to hold individual finger contacts in alignment with one another during bonding to the printed circuit board. Also the plated contact area of the finger contacts are protected by the tape during subsequent handling operations.

BRIEF DESCRIPTION OF THE DRAWINGS

The aforementioned aspects and advantages of the invention, as well as other aspects and advantages, will be better understood upon a consideration of the following detailed description and the appended claims taken in conjunction with the attached drawings of an illustrative embodiment in which:

DETAILED DESCRIPTION

Figure 1:
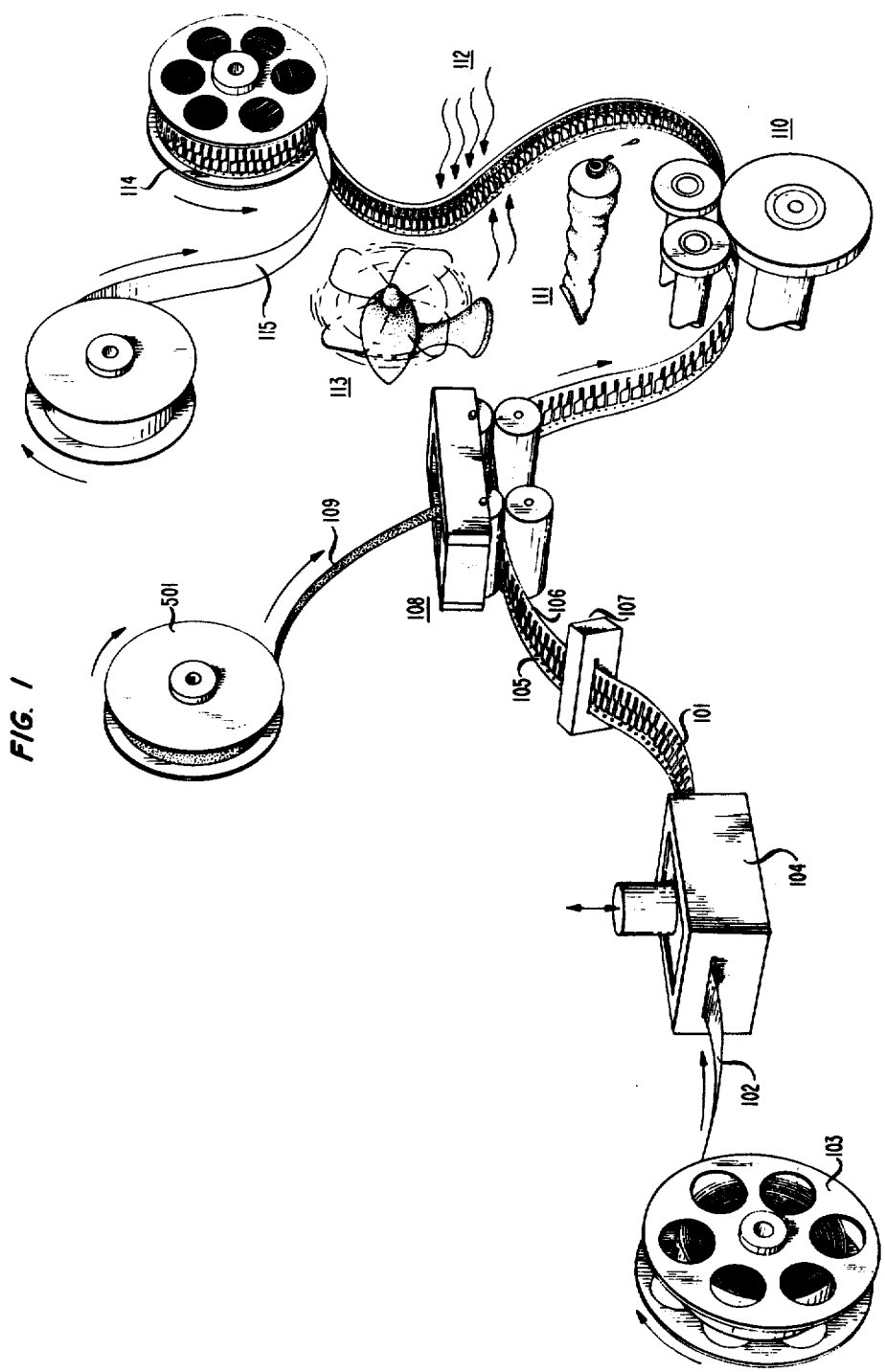
FIG. 1 illustrates schematically the steps in the method for manufacturing bondable finger contacts.

A method for making bondable finger contacts 101 for application to a printed circuit board (not shown) is schematically illustrated in FIG. 1. In accordance with the method, a virtually continuous, flat web 102 of electrically conductive material is fed from a payout reel 103 to a first station 104. At station 104 web 102 is stamped or chemically etched to form a plurality of finger contacts 101 which are coupled to one another by carrier strips 105 and 106.

Figure 2:
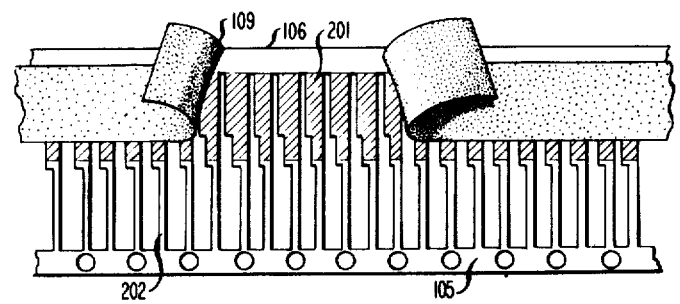
FIG. 2 illustrates the contact side of the bondable finger contacts.

Following the forming operation, a thin layer of contact metal 201, such as gold, as shown in FIG. 2, is applied to a selected area on the contact side of finger contacts 101 and to both sides of tail area 202. A thicker layer of contact metal such as gold is then applied to a selected area of the contact region. This plating is performed at a second station 107. Web 102 is then fed to a third station 108 where an adhesive-carrying tape 109 is applied in continuous fashion to the plated contact area. Adhesive-carrying tape 109 protects the plated contact area and also interconnects and supports finger contacts 101 during subsequent handling.

Figure 3:
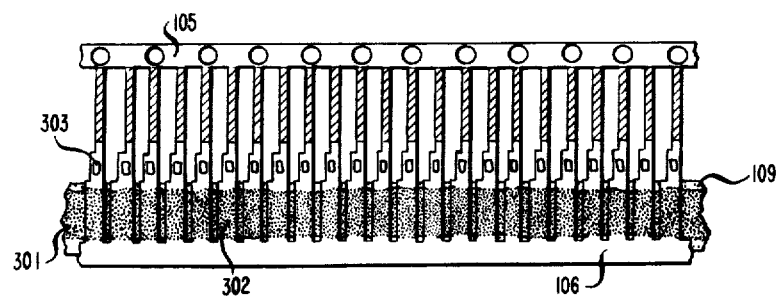
FIG. 3 illustrates the bonding side of the bondable finger contacts.

After web 102 leaves tape application station 108, it passes through a fourth station 110 at which a coat of adhesive 301, as shown in FIG. 3, is applied to finger contacts 101 on a side opposite that on which tape 109 is applied. Adhesive 301 is used to bond finger contacts 101 to the circuit board (not shown).

Following application of adhesive 301, web 102 passes through a fifth station 111 where a solder paste 303 is applied to web 102 for connector strips which are to be used in a reflow solder application. Following application of solder paste 303, web 102 is heated and dried at a sixth station 112. This heating step drives off any volatile materials associated with adhesive 301 and solder paste 303. A free length of web 102, which may or may not have forced air directed at it at station 113, is cooled thereby facilitating subsequent handling of web 102 such as winding on a take-up reel 114. During winding, a virtually continuous strip of paper 115 is simultaneously fed to take-up reel 114 to provide separation of each layer of web 102 on take-up reel 114.

Figure 4:
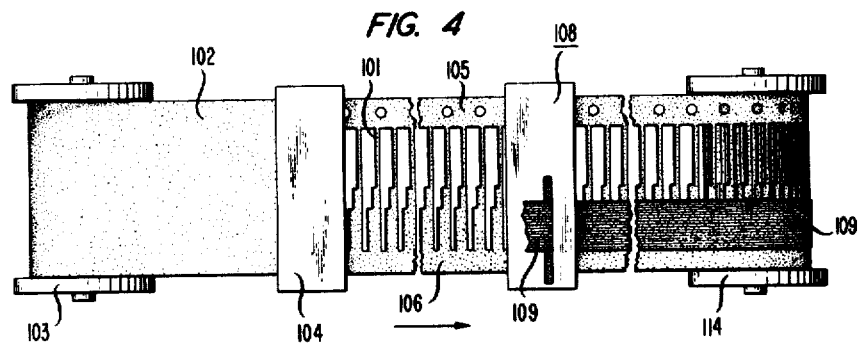
FIG. 4 illustrates the payout of a virtually endless strip of electrically conductive material from a first reel, passage through a forming station and a tape applying station, and take up of the finger contacts on a second reel.

FIGS. 2, 3 and 4 illustrate in more detail a section of web 102 especially the plated contact area and adhesive coated area of finger contacts 101. The web width is chosen so as to be compatible with standard 35 millimeter film handling equipment. Consequently, much of the needed equipment and its associated engineering is available for immediate use.

The particular design of finger contacts 101 serves a dual purpose in that it may be used for both reflow and wave solder attachment. Tails 202 may be cut to any length, depending upon the particular application chosen. Generally, no tail would remain when reflow attachment is used. The wider contact area is left generously long so that it may be used advantageously in a variety of applications.

In the preferred embodiment the electrically conductive material comprising web 102 is CDA 725 alloy. This is an alloy of copper, nickel and tin which is widely used by the connector industry for spring contacts. This material is preferred for several reasons. First, since finger contacts 101 are added directly to the thickness of the printed circuit board, their in-place thickness should be compatible with conventionally made contacts. Second, finger contacts 101 should be stiff enough to remain undamaged during subsequent handling and insertion operations. Third, the base material should be hard enough so that it is susceptible to being punched easily and cleanly. Fourth, this alloy possesses a smooth and generally defect-free surface which lends itself to subsequent plating operations. Finally, utilization of CDA 725 alloy as a base material produces a very smooth, plated surface having sufficient intrinsic strength to bridge minor defects in a printed circuit board.

The desired contact pattern is imparted to web 102 by a multi-fingered punching die used in a conventional high-speed punch press or by a chemical etching process. Following the punching or etching operation, in accordance with the preferred embodiment, a layer of between 1 and 7 microinches of soft gold is applied to both sides of finger contacts 101 except in region 302 where adhesive 301 is to be applied. A layer of 5 microinches is the preferred thickness. This is followed by a stripe of between 10 and 50 microinches of hard gold in the contact region but only on one side of web 102. Fifty microinches are used in the preferred embodiment. In the area where adhesive bonding is to be effected, the surface is allowed advantageously to oxidize during the cleaning operations incidental to the plating operations. The 50 microinches of hard gold used on the contact region are consistent with presently known good contact finishing practices. By virtue of this finish bondable finger contacts 101 have a surface life at least equivalent to conventionally formed gold finger contacts.

Once the metal finishing operations are completed, web 102 is provided with protective tape 109, adhesive coating 301 and, in the case of reflow solder finger contacts 101, a spot of solder paste 303 with flux in the location where reflow solder attachment is to occur. Protective tape 109 serves as a mask for adhesive 301 which prevents it from getting onto the contact region.

Figure 5:
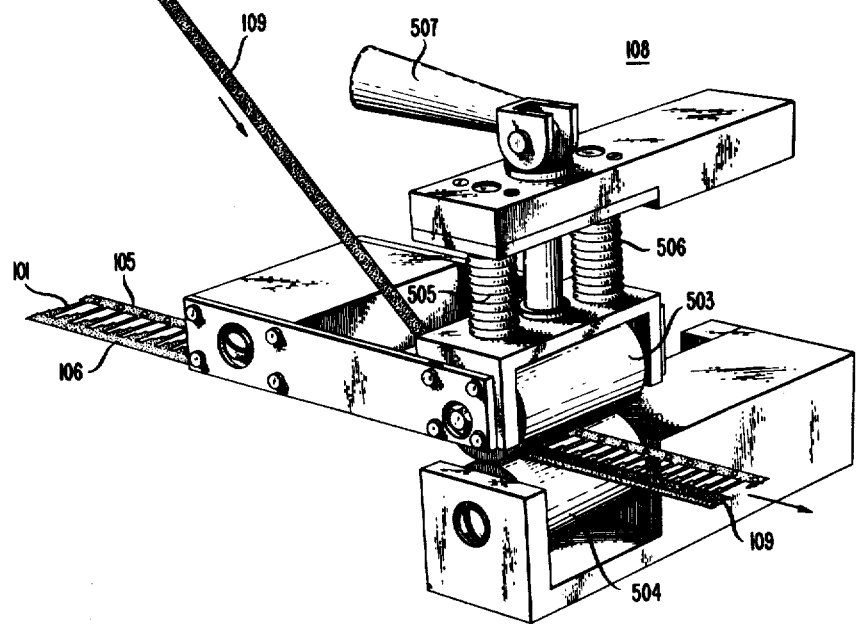
FIG. 5 illustrates apparatus for applying the adhesive bearing support tape to the finger contacts.

Protective tape 109 is fed from reel 501, as shown in FIG. 5, at a nearly constant tension provided by lever arm 502 to station 108. Station 108 includes rollers 503 and 504, coil springs 505 and 506 and locking mechanism 507. Springs 505 and 506 are held in a compressive state by locking mechanism 507 in order to maintain the pressure between rollers 503 and 504 at a generally constant level. As web 102 and protective tape 109 are passed between rollers 503 and 504, tape 109 is positioned so as to cover the plated contact region of finger contacts 101.

Protective tape 109 serves three major purposes. First, it protects the plated contact area from contamination and damage during strip manufacture and printed circuit board assembly. Second, it holds individual finger contacts 101 in alignment during their application to the printed circuit board. Third, it serves as a compliant member during bonding.

In order to satisfy these major functional purposes, protective tape 109 should exhibit certain physical characteristics. Among these characteristics are: protective tape 109 shoud be pressure sensitive; it should be dimensionally stable, that is, nonwrinkling; it should be capable of withstanding temperature up to 500 degrees F.; it should have an easily removable adhesive residue; it should be capable of withstanding wave solder fluxing, soldering, and cleaning; it should provide compliance during finger application; and, finally, it should be readily available and inexpensive. In the preferred embodiment a protective tape 109 which meets these requirements is a teflon material having a glass fabric reinforcing web such as that provided by tape model 5451 manufactured by the 3M Company. The adhesive used on this tape is a silicone pressure-sensitive adhesive.

Figure 6:
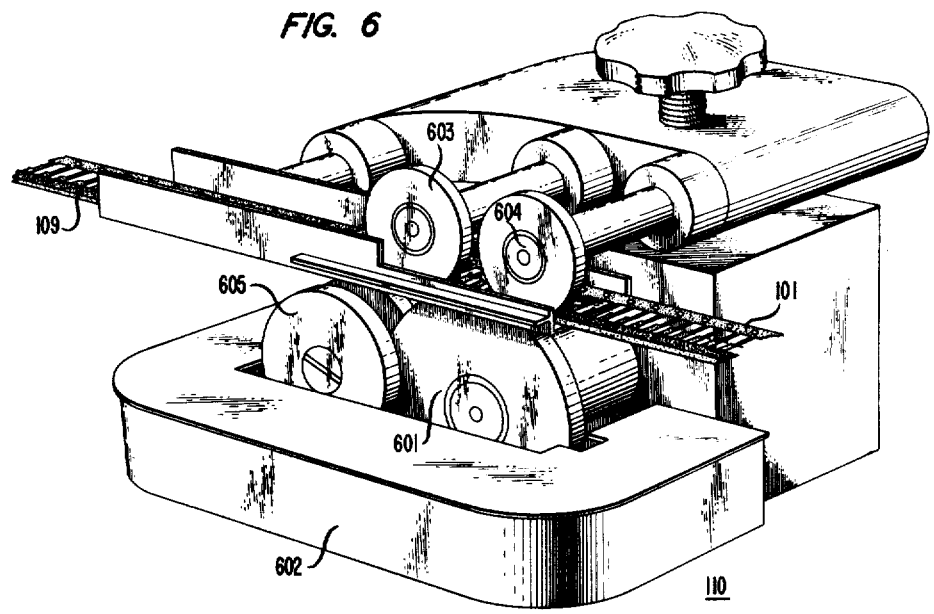
FIG. 6 illustrates apparatus used to apply adhesive to the finger contacts.

Following application of protective tape 109 to the contact region, web 102 is fed to adhesive applying station 110 as shown in more detail in FIG. 6. At station 110 adhesive 301 is applied by coated roller 601 to the under surface of bondable finger contacts 101. Roller 601 is replenished with adhesive 301 as it rotates through trough 602. The thickness of adhesive 301 applied to finger contacts 101 is controlled by the relative spacing between roller 601 and split doctor roller 605. Rollers 603 and 604 are used to drive web 102 through station 110.

Adhesive 301, in order to be suitable for the instant application, should have the following characteristics. It should have a cured peel strength greater than five pounds per inch; it should have a bondline thickness less than 0.002 inch; it should have high insulation resistance, noncorrosiveness, and be nontacky; it should have a pleasing appearance; and it should be readily available at low cost. One adhesive which meets these requirements is an 821B liquid adhesive manufactured by B. F. Goodrich. This adhesive is a nitrile-phenolic adhesive having a high solvent content. It has a long shelf life and is noncorrosive at almost all degrees of cure. One of its most important properties is that following application its solvents can be evaporated leaving a thin, nearly transparent film which is dry and nontacky. Adhesive 301 also has the desirable feature that it becomes tacky again when heated. This feature allows the contact strip to be firmly attached in position prior to curing. Following application of adhesive 301, the solvents are removed by heating and cooling operations.

Figure 7:
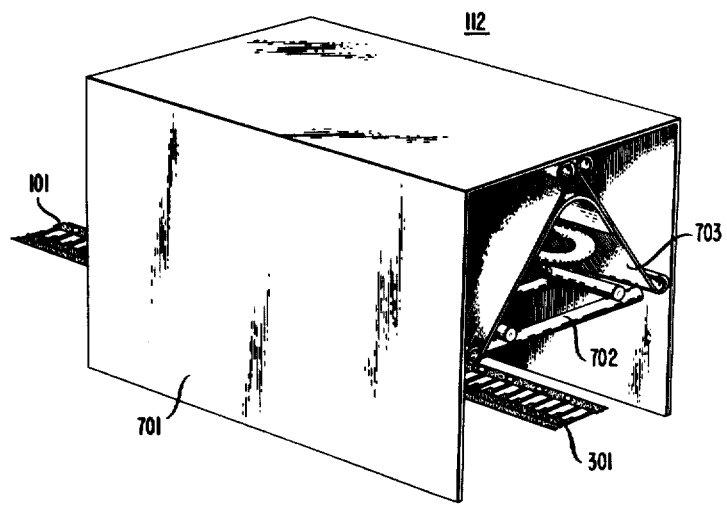
FIG. 7 illustrates apparatus for heating the applied adhesive and solder paste to drive off any volatile substances associated therewith.

Apparatus for effecting the heating operation is shown in FIG. 7. It is comprised of a generally U-shaped hood 701 which contains a number of heating coils 702 and angularly oriented reflective surfaces 703 for directing the heat onto the adhesive-coated surface area of finger contacts 101. By controlling the amount of current flowing through heating coils 702, the length of hood 701, and the speed of web 102, adequate drying of adhesive 301 is readily accomplished.

Following the heating step, the elevated temperatures of web 102 is reduced by passage of web 102 through cooling station 113. Cooling station 113, in the preferred embodiment, is comprised of a pair of conventional air blowers (not shown). Once web 102 is cooled, and adhesive 301 is sufficiently dry, paper interleaf 115 is rolled between layers of web 102 on takeup reel 114 to protect finger contacts 101 from dirt and damage.

The bondable finger contacts 101 produced in accordance with the above-described method may be applied to a printed circuit board during its initial fabrication or they can be used advantageously to effect repairs to damaged contacts on printed circuit boards. A method for affixing bondable finger contacts 101 to a printed circuit board is disclosed in the copending application of Carrillo and Madden noted previously.

In all cases it is to be understood that the above-described embodiment is illustrative of but a small number of many possible specific embodiments which can represent applications of the principles of the invention. Thus, numerous and various other embodiments can be devised readily in accordance with these principles by those skilled in the art without departing from the spirit and scope of the invention.

What is claimed is:

1. Apparatus for making bondable finger contacts for application to a printed circuit board including means for forming a strip of virtually continuous, flat, electrically conductive material so as to produce a plurality of spaced-apart finger contacts integral with and interconnected by at least one support carrier, each of said finger contacts having a contact region thereon characterized in that the apparatus further includes:

means for applying a tape having an adhesive on one side thereof to one side of the contact region of said plurality of contacts to protect, interconnect and support said contacts; and means for applying a coat of adhesive to an opposite side of said contact region of said plurality of contacts to facilitate bonding said contacts to said circuit board.

2. The apparatus in accordance with claim 1 wherein the tape applying means comprises:
 first and second rollers;
 means for feeding said tape at a controlled tension between said rollers; and
 means for controlling a pressure exerted by said first roller on said second roller thereby controlling the pressure with which said tape is applied to said contact region.

3. The apparatus in accordance with claim 2 wherein the controlling means comprises:
 first and second coil springs; and
 means for holding said coil springs in a compressive state.

4. The apparatus in accordance with claim 1 wherein the adhesive applying means comprises:
 a first roller;
 a trough generally surrounding said first roller for holding said adhesive; and
 means for controlling the thickness of said adhesive applied to said contact region.

5. The apparatus in accordance with claim 1 further including:
 means for selectively applying a coating of contact metal to said contact region of said finger contacts.

6. The apparatus in accordance with claim 1 further including:
 means for heating said adhesive to drive off any volatile material associated therewith; and
 means for cooling said heated adhesive to enable subsequent handling of said adhesive-coated finger contacts.

7. The apparatus in accordance with claim 6 wherein the heating means comprises:
 a generally U-shaped hood;
 a plurality of heating coils affixed to said hood; and
 first and second angularly oriented reflective surfaces, interposed between said heating coils and a top surface of said hood, for directing heat onto said adhesive coated contact region.

8. The apparatus in accordance with claim 1 further including:
 means for feeding said adhesive-coated finger contacts and a virtually continuous strip of paper to a take-up reel; and
 means for winding said finger contacts and said strip of paper on said take-up reel so that layers of said finger contacts carrying said coat of adhesive are separated from one another by said strip of paper.

* * * * *